United States Patent [19]

Braun et al.

[11] 4,340,853
[45] Jul. 20, 1982

[54] METHOD OF TESTING THE WINDINGS AND INSULATION SYSTEM OF A MOTOR BY APPLYING THE TEST VOLTAGE BEFORE COMPLETING A PATH TO GROUND

[75] Inventors: John L. Braun, Ashland; Denver W. Smith, Bedford; William J. Ekey, Ashland, all of Ohio

[73] Assignee: McNeil Corporation, Akron, Ohio

[21] Appl. No.: 85,765

[22] Filed: Oct. 17, 1979

[51] Int. Cl.³ .................... G01R 31/06; G01R 31/12; H02K 15/00; H02H 7/09
[52] U.S. Cl. ........................................ 324/51; 29/593; 310/71; 324/54; 361/33
[58] Field of Search .................. 324/51, 54, 158 MG; 29/593, 596–598; 310/71, 42; 361/33

[56] References Cited
U.S. PATENT DOCUMENTS

| | | | |
|---|---|---|---|
| 3,564,569 | 2/1971 | Nolan | 29/593 |
| 3,694,909 | 10/1972 | Hallerback | 29/593 X |
| 3,801,730 | 4/1974 | Nakata et al. | 29/593 X |
| 3,867,658 | 2/1975 | Dochterman | 310/71 |
| 4,041,543 | 8/1977 | Pasculle et al. | 361/33 |
| 4,110,651 | 8/1978 | Fagan | 310/71 X |

Primary Examiner—Gerard R. Strecker
Attorney, Agent, or Firm—Hamilton, Renner & Kenner

[57] ABSTRACT

An electrically surge protected motor having a submersible housing (10) can be manufactured and tested for insulation weaknesses by first assembling the motor components in the housing (10) without completing a path to ground therethrough. Then the windings (11, 12) of the motor may be subjected to a voltage surge greater than the voltage magnitude at which the motor is to be surge protected. After completion of the test, a path to ground through an impedance device (17) which establishes the voltage magnitude at which the motor is to be protected may be completed. Several alternative grounding devices (23, 24, 25, 26 or 28) may be provided externally of the housing (10).

4 Claims, 7 Drawing Figures

4,340,853

METHOD OF TESTING THE WINDINGS AND INSULATION SYSTEM OF A MOTOR BY APPLYING THE TEST VOLTAGE BEFORE COMPLETING A PATH TO GROUND

TECHNICAL FIELD

This invention relates to a method and apparatus for grounding low level surge protection devices to protect the windings of a submersible motor such as is used for a submersible pump. More particularly, this invention relates to a method and apparatus in which the windings and insulation of a low level surge protected motor can be tested prior to the grounding of the protective device.

BACKGROUND ART

The manufacture of submersible motors for pumps or the like is often complicated by two sometimes conflicting requirements. First, it is necessary to protect the motor against electical surges caused by lightning, power surges and switching surges. Such devices can be designed to protect against extremely high level surges, on the order of 2000 to 3000 volts or can be made more sensitive to protect against low level surges, on the order of 350 volts. Although external lightning arresters or surge protectors can be provided, for example, at the top of a well if the motor is to be used to pump water from a well, it is most desirable to provide the surge protection device inside the motor.

Counteracting the need for surge protection is the requirement that the motor be tested after complete assembly to determine if there are any weaknesses in the insulation system, lead wires or the like. Such a test, commonly referred to as a "hi-pot" test subjects the motor to high voltages defined as 1000 volts plus twice the line voltage for one minute or 1.2 times this voltage for one second. Thus, if the line voltage is 230 volts, for example, the motor would be subjected to 1460 volts for one minute or 1752 volts for one second.

The conflict between the two requirements should be apparent. If internal low level surge protection is desired, the hi-pot voltage would exceed the limit of the protection device and would go to ground, thus defeating the purpose of the test. Presently, the only internal devices used are for high level surge protection where the hi-pot voltage does not exceed the limit of the protection device. Usually these types of devices are air gap devices where the 2000 or 3000 volts will spark over to ground. However, not only are these devices limited to high level protection, as previously described, but they are also subject to life limitations in the number of spark-overs.

DISCLOSURE OF THE INVENTION

It is thus a primary object of the present invention to provide a motor, and method of manufacture thereof, which can be tested for insulation system weaknesses yet be low level surge voltage protected internally thereof.

It is another object of the present invention to provide a motor, and method of manufacture thereof, as above, which has a path to ground established after manufacture and testing thereof is completed.

It is a further object of the present invention to provide a motor, and method of manufacture thereof, as above, which is grounded externally to the housing of the motor.

These and other objects of the present invention, which will become apparent from the description to follow, are accomplished by the device and method of manufacture thereof hereinafter described and claimed.

In general, an electrically surge protected submersible motor can be manufactured and tested for insulation weaknesses by first assembling the motor components in the housing without providing a path to ground. The windings of the motor may then be subjected to a test voltage greater than the voltage magnitude at which the motor is to be surge protected. When the test is completed, a path to ground through an impedance device which establishes the voltage magnitude at which the motor is to be protected may be completed by providing a path to ground from the impedance device externally to the housing.

PREFERRED EMBODIMENTS FOR CARRYING OUT THE INVENTION

Figure 1:
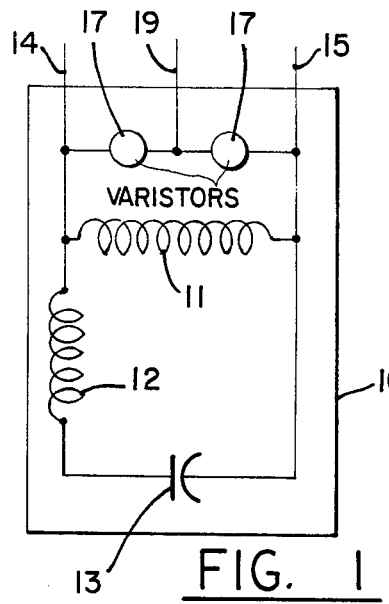
FIG. 1 is a schematic electrical diagram of a motor according to the concept of the present invention.
Figure 2:
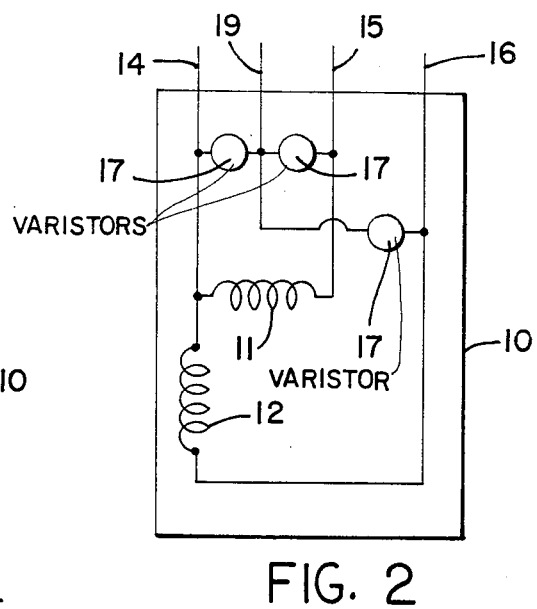
FIG. 2 is a schematic electrical diagram of an alternate embodiment of a motor according to the concept of the present invention.

While many types of motors could utilize the concepts of the present invention, shown herein in FIG. 1 and 2 are conventional single-phase induction motors depicted schematically in a submersible housing 10 and having split windings, that is, a main winding 11 and an auxiliary or starting winding 12. Specifically, the motor of FIG. 1 is of the permanent-split-capacitor type single-phase induction motor having a capacitor 13 in series with winding 12. Line voltage, for example, is applied across winding 11 through leads 14 and 15 which extend out of housing 10. The motor of FIG. 2 is susceptible to any type of starting procedure external of the housing 10 with lead 16 being provided for this purpose.

In both FIG. 1 and 2 motors, protection against electrical surges is afforded by metal oxide varistors 17 located between ground and lead lines 14, 15 and 16, respectively. As is well known in the art, a varistor is a semiconductor nonlinear impedance device, and more specifically is a ceramic voltage dependent nonlinear resistor, which displays an impedance characteristic which is inversely proportional to the voltage applied across it. Thus under normal operating conditions of the motor the impedance of the motor windings 11 and 12 will be far less than the impedance of varistors 17. However, if an electrical surge of sufficiently high voltage is present, the impedance of varistors 17 will be far less than that of windings 11 and 12 and the surge will go through varistors 17 to ground through ground wire 19 extending out of housing 10. The characteristics of the particular varistor utilized is selected according to predetermined parameters relating to the degree of surge protection desired. For example, if low level surge protection is desired, the varistors selected could be of the type which would conduct at 350 volts. Similarly, if high level protection were all that was desired, the varistors selected could be of such design so as not to conduct until a much larger voltage, such as 2000 volts.

As previously described, these motors must be tested to assure, for example, that there is not any problem with the insulation between the winding and the stator core, which is effectively in contact with the housing. During such testing, called "hi-potting", assuming a line voltage of 230 volts, a high voltage on the order of 1460 volts would be applied between one of the power leads 14 or 15 and the housing 10. If high level surge protection through varistors 17 is contemplated, then varistors 17 may be grounded before and during the test because they will not conduct during the test. However, if any surge protection below the hi-pot voltage is required, varistors 17 cannot be grounded during the test, but only thereafter.

Figure 3:
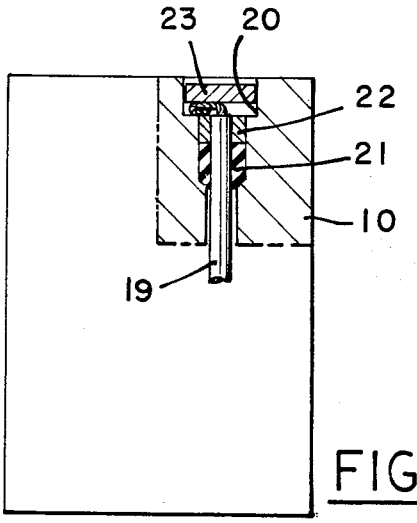
FIG. 3 is a schematic depiction of the motor housing showing only the portion thereof relating to the grounding of the motor in sectional detail.

Alternate methods of providing a path to ground through varistors 17 after assembling and testing the motor are shown in FIGS. 3–7, inclusive. As shown in FIG. 3, insulated ground wire 19 extends upwardly through a bore and counterbore 20 in housing 10. A gasket 21 and ferrule 22 made of a conducting material, such as brass or the like, extend around wire 19 within the counterbore. During the hi-pot testing, ground wire 19 is not connected. Thereafter, the insulation is stripped away and an electrically conducting plug 23, such as a brass disc, is inserted in the counterbore against the bare wire to effectively complete the ground path to the housing.

Figure 4:
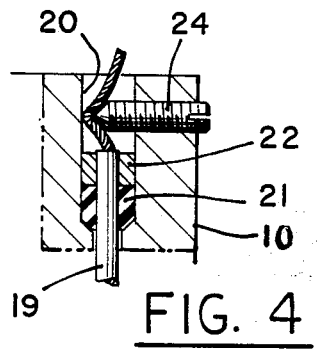
FIG. 4 is an alternate embodiment of the portion of FIG. 3 shown in detail.
Figures 5, 6:
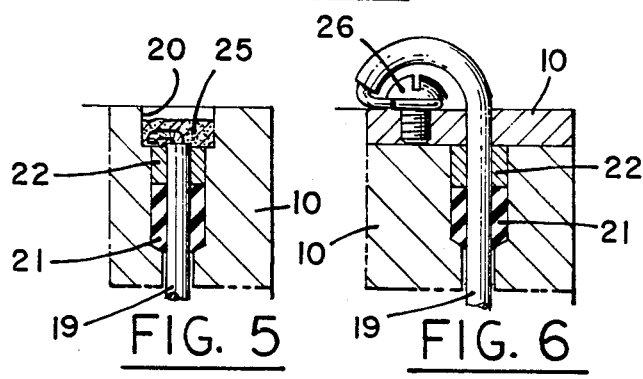
FIG. 5 is an alternate embodiment of the portion of FIG. 3 shown in detail.
FIG. 6 is an alternate embodiment of the portion of FIG. 3 shown in detail.
Figure 7:
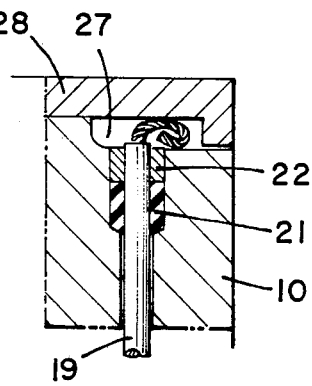
FIG. 7 is an alternate embodiment of the portion of FIG. 3 shown in detail.

FIGS. 4–7, inclusive, show other convenient ways to complete the ground. In FIG. 4 a brass or stainless steel set screw 24 may be inserted through housing 10 to contact the stripped wire 19 or penetrate the insulation to contact the bare wire if the insulation has not been stripped therefrom. In FIG. 5 it is shown that a low melt solder 25 can effectively replace the brass plug 23 of FIG. 3 to complete the path to ground. In FIG. 6 wire 19 is grounded to housing 10 by means of a screw 26 inserted into housing 10 externally thereof. Finally, in FIG. 7 it is shown that the ground connection may be completed by sandwiching the bare wire in a cast slot 27 formed in a portion of the housing 10 with the suction bowl 28 portion of housing 10 being placed thereover to complete the ground connection.

It should thus be evident that a submersible motor constructed according to the concept of the present invention will enable one to provide internal low level surge protection and yet offer the ability to test the motor and otherwise accomplishes the objects of the invention.

We claim:

1. A method of testing the windings and insulation system of an electrical surge protected motor having a submersible housing in electrical contact with ground comprising the steps of assembling the motor in the housing without providing an electrically conductive path from the motor windings through the housing to ground, subjecting the windings and insulation system of the motor to a voltage greater than the voltage magnitude at which the motor is to be protected in order to test for weaknesses in the insulation system, and testing for the absence of a short circuit between the windings and the housing, and in the event of an absence of a short circuit between the windings and the housing thereafter completing a voltage sensitive electrical conductive path from the motor windings through the housing to ground.

2. A method according to claim 1 wherein said step of assembling the motor includes the step of providing an impedance device in said electrical conductive path from the windings to the housing which will conduct only at a voltage magnitude equal to or greater than the voltage magnitude at which the motor is to be protected.

3. A method according to claim 2 wherein said impedance device is in the path from the motor windings through the housing to ground.

4. A method according to claim 1 wherein said step of completing a voltage sensitive conducting path from the motor windings through the housing to ground is accomplished externally of the housing.

* * * * *